(12) United States Patent
Hebert

(10) Patent No.: US 8,287,751 B1
(45) Date of Patent: Oct. 16, 2012

(54) SYSTEM AND METHOD FOR PROVIDING A CONTINUOUS BATH WETDECK PROCESS

(75) Inventor: Jeffrey Hebert, Rowlett, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 1345 days.

(21) Appl. No.: 10/889,903

(22) Filed: Jul. 13, 2004

(51) Int. Cl.
*B08B 3/00* (2006.01)

(52) U.S. Cl. ............... 216/88; 134/1.3; 438/689

(58) Field of Classification Search .......... 216/88, 216/89, 90, 92; 134/1.3, 902; 438/689; 156/345.18
See application file for complete search history.

(56) References Cited

U.S. PATENT DOCUMENTS

| | | | | | |
|---|---|---|---|---|---|
| 4,458,703 | A | * | 7/1984 | Inoue et al. | 134/57 R |
| 4,804,464 | A | * | 2/1989 | Schevey | 210/96.1 |
| 4,907,611 | A | * | 3/1990 | Shibano | 134/60 |
| 5,538,024 | A | * | 7/1996 | Inada et al. | 134/60 |
| 5,722,441 | A | * | 3/1998 | Teramoto | 134/56 R |
| 5,896,874 | A | * | 4/1999 | Nakagawa et al. | 134/56 R |
| 6,158,447 | A | * | 12/2000 | Kamikawa et al. | 134/56 R |
| 6,178,975 | B1 | * | 1/2001 | Aoki | 134/57 R |
| 6,221,167 | B1 | * | 4/2001 | Karasawa | 134/1 |
| 6,290,777 | B1 | * | 9/2001 | Imaoka et al. | 134/1 |
| 6,863,079 | B2 | * | 3/2005 | You et al. | 134/94.1 |
| 2002/0059943 | A1 | * | 5/2002 | Inagaki | 134/18 |
| 2003/0010364 | A1 | * | 1/2003 | Lerner et al. | 134/108 |
| 2005/0142883 | A1 | * | 6/2005 | Hiraoka et al. | 438/692 |

OTHER PUBLICATIONS

"Fresh". Merriam-Webster Online taken from www.m-w.com.*

* cited by examiner

*Primary Examiner* — Sylvia R. MacArthur
(74) *Attorney, Agent, or Firm* — Wade J. Brady, III; Frederick J. Telecky, Jr.

(57) ABSTRACT

A system and method is described for providing a continuous bath wetdeck process for use in the manufacture of semiconductor wafers. The invention provides a method for extending an effective working life of a chemical bath of the type that comprises a chemical bath liquid within a chemical bath container. An amount of fresh chemical is continuously added to the chemical bath liquid and an amount of chemical bath liquid is simultaneously purged from the chemical bath container. A balance is maintained between the amount of fresh chemical that is added to the chemical bath liquid and the amount of chemical bath liquid that is purged in order to maintain the effectiveness of the chemical bath liquid to clean semiconductor wafers within the chemical bath.

32 Claims, 5 Drawing Sheets

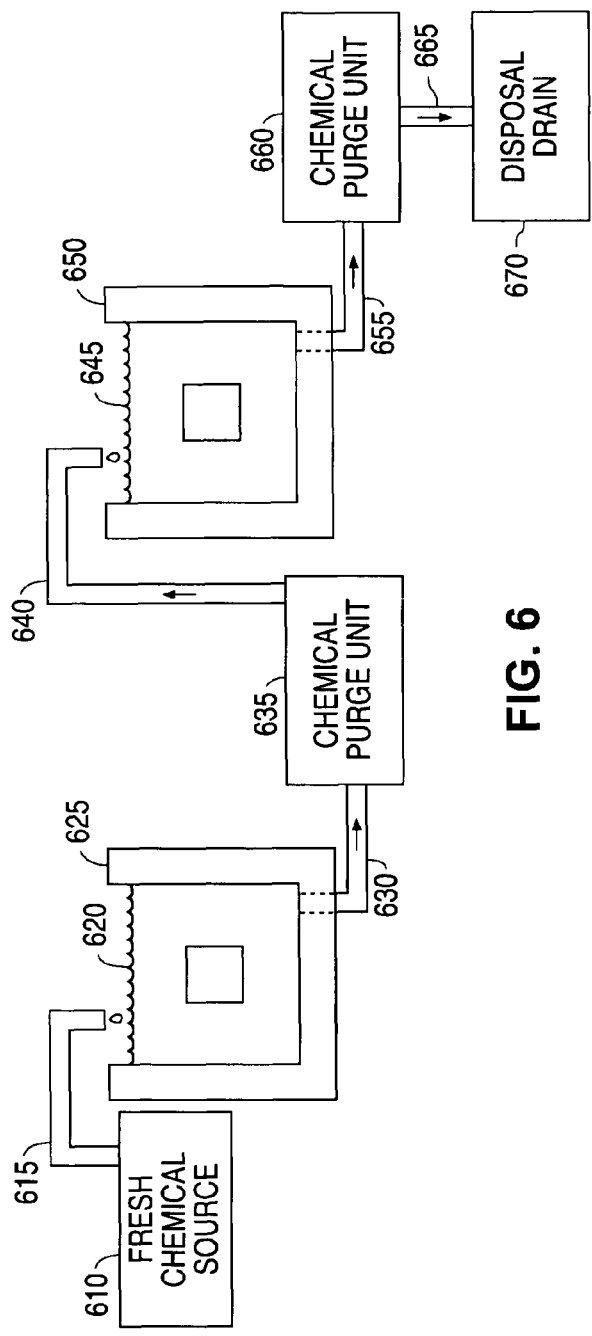
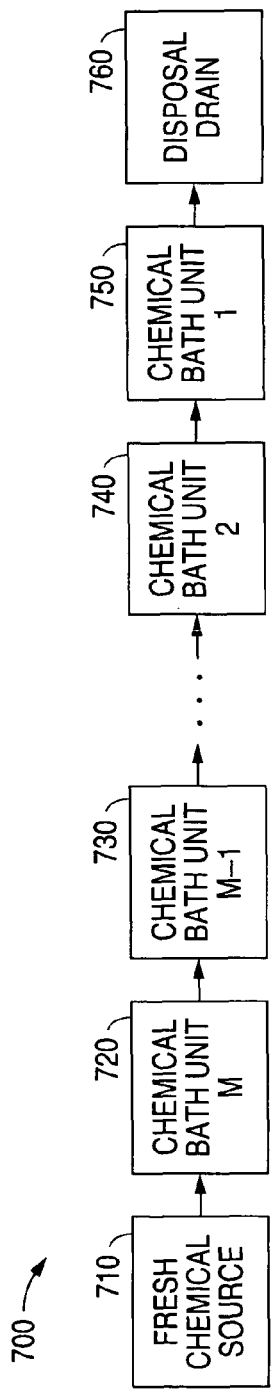
FIG. 6
FIG. 7

SYSTEM AND METHOD FOR PROVIDING A CONTINUOUS BATH WETDECK PROCESS

TECHNICAL FIELD OF THE INVENTION

The present invention is generally directed to technology for manufacturing semiconductor wafers and, in particular, to a system and method for providing a continuous bath wetdeck process during the manufacture of semiconductor wafers.

BACKGROUND OF THE INVENTION

Semiconductor wetdeck processes are employed during the manufacture of semiconductor wafers. There are various types of semiconductor wetdeck processes (e.g., diffusion, wet etch, resist strip, bath develop, etc.). Consider a diffusion wetdeck process as an exemplary semiconductor wetdeck process. A diffusion wetdeck process comprises at least one chemical bath for cleaning the semiconductor wafers. A chemical bath generally comprises a chemical bath liquid within a chemical bath container. The semiconductor wafers are placed in the chemical bath and the chemicals in the chemical bath treat the semiconductor wafers. For example, semiconductor wafers may be subjected to chemicals to clean organic contaminants from the surface of the semiconductor wafers.

As the semiconductor wafers are treated the process chemicals are consumed. The process chemicals may break down, evaporate, or combine with other chemicals. As time goes by the effectiveness of the chemical process decreases. Eventually the effectiveness of the chemicals in the chemical bath is spent.

When the chemicals in a chemical bath are no longer effective, the chemical bath container is totally drained and replaced with new chemicals. The provision of a new chemical bath is referred to as a "solution change." The "solution change" occurs at a prescribed frequency. The frequency of "solution change" may be based on time, on chemical bath usage, or on some measurement of chemical bath performance. There is an unavoidable period of "down" time while the "solution change" process is being performed. In addition, the provision of new chemicals for the chemical bath incurs additional cost.

Therefore, there is a need in the art for a system and method that is capable of extending the effective working life of a chemical bath in a semiconductor wetdeck process.

SUMMARY OF THE INVENTION

To address the above-discussed deficiencies of the prior art, it is a primary object of the present invention to provide a system and method for extending the effective working life of a chemical bath in a semiconductor wetdeck process.

In one advantageous embodiment of the method of the present invention the effective working life of a chemical bath is extended by (1) continuously adding an amount of fresh chemical to the chemical bath liquid of the chemical bath, and (2) continuously purging an amount of the chemical bath liquid from the container that contains the chemical bath liquid.

A fresh chemical source is provided that is capable of continuously adding an amount of fresh chemical to the chemical bath liquid. In addition, a chemical purge unit is provided that is capable of continuously purging an amount of the chemical bath liquid from the container that contains the chemical bath liquid. A fresh chemical source control unit that is coupled to the fresh chemical source controls the amount of chemical that is dispensed by the fresh chemical source. A chemical purge control unit that is coupled to the chemical purge unit controls the amount of chemical bath liquid that is purged by the chemical purge unit.

It is an object of the present invention to provide a system and method for extending the effective working life of a chemical bath in a semiconductor wetdeck process.

It is also an object of the present invention to provide a system and method for continuously adding an amount of fresh chemical to the chemical bath liquid of a chemical bath.

It is yet another object of the present invention to provide a system and method for continuously purging an amount of the chemical bath liquid from a container that contains a chemical bath liquid;

It is still another object of the present invention to provide a system and method for maintaining a balance between an amount of fresh chemical continuously added to a chemical bath liquid and an amount of a chemical bath liquid continuously purged from a chemical bath container to maintain an effectiveness of a chemical bath liquid to clean semiconductor wafers.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 6 illustrates a first chemical bath unit of the present invention coupled in series with a second chemical bath unit of the present invention;

FIG. 7 illustrates a chain of "M" chemical bath units of the present invention coupled in series.

DETAILED DESCRIPTION OF THE INVENTION

Figure 1:
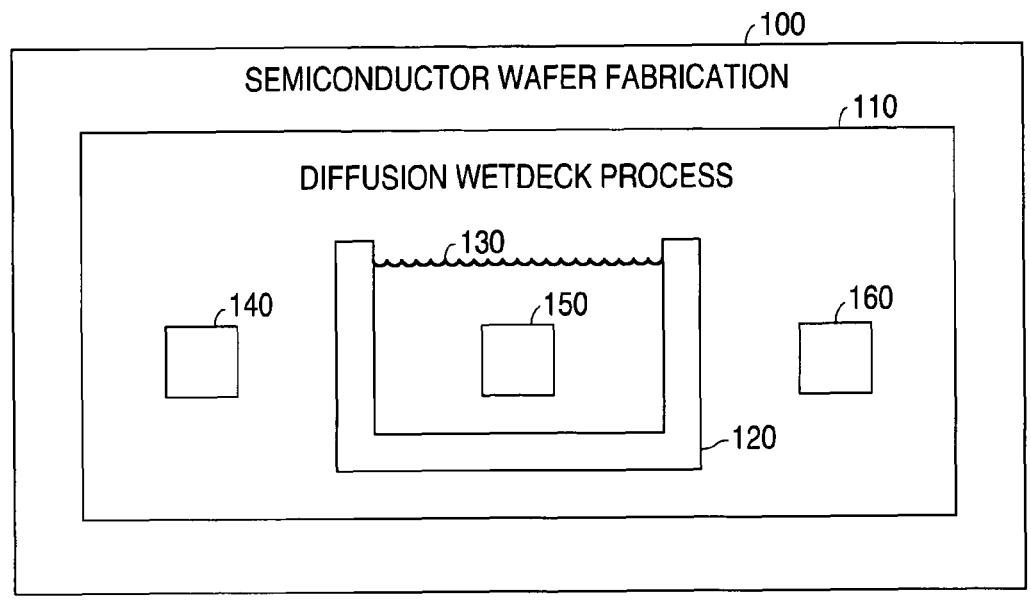
FIG. 1 illustrates a schematic representation of a prior art diffusion wetdeck process.

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged chemical bath for semiconductor wafers.

To simplify the drawings the reference numerals from previous drawings may sometimes not be repeated for structures that have already been identified.

FIG. 1 illustrates a schematic representation of a prior art diffusion wetdeck process. An exemplary semiconductor wafer fabrication process 100 comprises an exemplary diffusion wetdeck process 110. The diffusion wetdeck process 110 comprises at least one chemical bath for cleaning semiconductor wafers. An exemplary chemical bath is represented in FIG. 1 by a prior art chemical bath container 120 that contains a chemical bath liquid 130. Chemical bath liquid 130 may comprise a different type of chemical solution for each chemical bath. That is, each type of chemical bath will have a specific type of chemical solution.

For example, chemical bath liquid 130 may comprise a chemical solution for removing trace organic contamination from semiconductors wafer and for oxidizing exposed silicon surfaces of the semiconductor wafers. A well-known chemical bath of this type is referred to as a "piranha bath." The chemical bath liquid 130 for a piranha bath initially comprises, for example, approximately eighty seven and sixty hundredths weight percent (87.60 wt %) of $H_2SO_4$, five and twenty hundredths weight percent (5.20 wt %) of $H_2SO_5$, and two hundredths weight percent (0.02 wt %) of $H_2O_2$, and the balance $H_2O$.

During the chemical bath process a semiconductor wafer 140 that is to be cleaned is submerged in the chemical bath liquid 130. The semiconductor wafer submerged in chemical bath liquid 130 is designated with reference numeral 150. After the chemical bath has cleaned semiconductor wafer 150, then the semiconductor wafer 150 is removed from the chemical bath. The cleaned semiconductor wafer that is removed from the chemical bath is designated with reference numeral 160.

As more and more semiconductor wafers are cleaned during the prior art process, the ability of the chemical bath to perform the cleaning process decreases over time. The decrease in cleaning performance of the chemical bath is due to a number of factors. A first portion of the cleaning chemicals may be consumed (e.g., by breaking down) during the cleaning treatment of the semiconductor wafers. A second portion of the cleaning chemicals may react with other chemicals in the chemical bath and thereby cease to be active. A third portion of the cleaning chemicals may evaporate from the chemical bath.

In addition, the chemical bath may become contaminated with other chemicals over time. For example, the chemical reactions that occur during the cleaning process may generate water, $H_2O$, as a by-product. As the amount of water in the chemical bath accumulates over time the concentration of the chemical bath is diluted and the cleaning ability of the chemical bath decreases. Another example of a contaminant is carbon. If the chemical bath is stripping carbon from the semiconductor wafers in the bath, then the amount of carbon in the chemical bath will accumulate over time. The increased levels of carbon contamination in the chemical bath will reduce the ability of the chemical bath to effectively clean the semiconductor wafers.

There is also a certain amount of chemical bath liquid 130 that is lost from the chemical bath when the semiconductor wafers are removed from the chemical bath. A small amount of chemical bath liquid 130 will physically adhere to the surface of each of the semiconductor wafers when the semiconductor wafers are removed from the chemical bath. The process by which chemical bath liquid 130 is removed from the chemical bath container 120 in this manner is referred to as a "drag out" process. The amount of chemical bath liquid 130 that is removed by "drag out" may vary from a few milliliters to one hundred milliliters (100 ml) or more per semiconductor wafer. Over time the amount of chemical bath liquid 130 that is removed by "drag out" may accumulate to appreciable levels.

Eventually the chemical bath liquid 130 in the chemical bath container 120 becomes spent and can no longer effectively perform the cleaning function. Prior art methods to extend the effective life of the chemical bath include (1) taking steps to minimize "drag out" losses, (2) adding chemical bath liquid 130 to compensate for "drag out" losses, and (3) adding chemical bath liquid 130 to compensate for dilution and contamination in the chemical bath. Adding chemical bath liquid 130 to extend the effective life of the chemical bath is referred to as "spiking" the chemical bath.

Eventually, however, the chemical bath becomes so spent that these steps are no longer effective. Then the spent chemical bath liquid 130 is totally drained from chemical bath container 120. After the chemical bath container 120 is empty, then a fresh supply of chemical bath liquid 130 is provided. Chemical bath container 120 is then filled with the fresh supply of chemical bath liquid 130 and the process of cleaning semiconductor wafers continues with the new chemical bath liquid 130. The replacement of the spent chemical bath liquid 130 with the new chemical bath liquid 130 is referred to as a "solution change." Each new "solution change" generally occurs at a prescribed frequency. The frequency may be based on time, on bath usage, or on some specified measurement of the chemical bath performance.

A number of prior art methods exist for performing a "solution change." For example, one prior art method employs a solvent or some other chemical to flush the spent chemical bath liquid 130 out of the chemical bath container 120. Another prior art method also rinses out the chemical bath container 120 with fresh chemical. The fresh chemical that is used to perform the rinse is drained out of the chemical bath container 120 before the chemical bath container 120 is filled with new chemical bath liquid 130.

Figure 2:
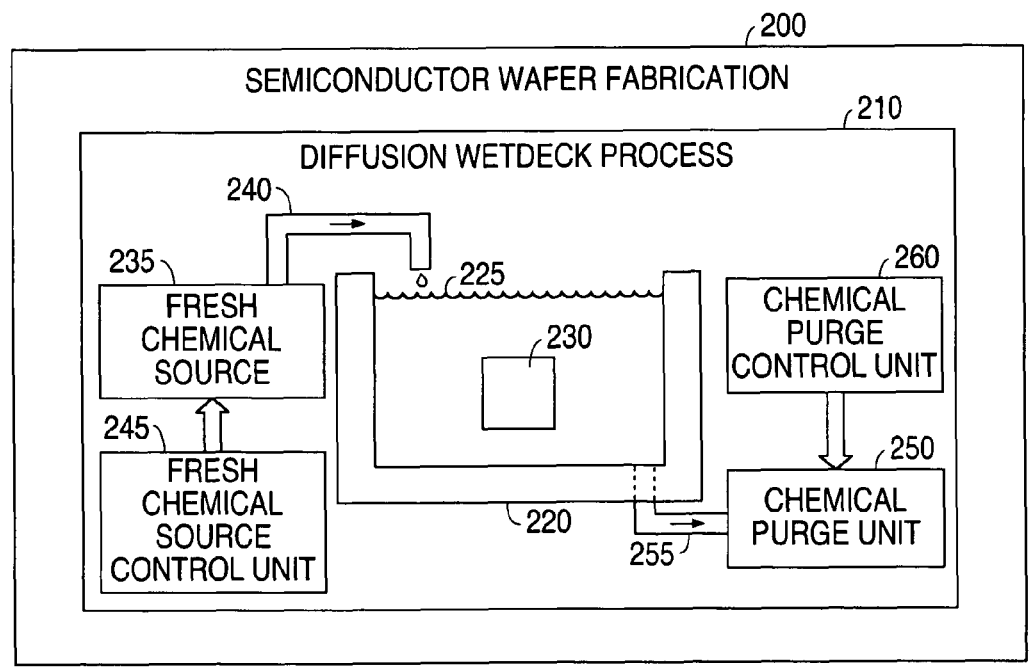
FIG. 2 illustrates a schematic representation of a diffusion wetdeck process carried out in accordance with the principles of the present invention.

The present invention, however, provides a continuous chemical bath and a "solution change" is not required. Consider the chemical bath of the present invention shown schematically in FIG. 2. An exemplary semiconductor wafer fabrication process 200 comprises an exemplary diffusion wetdeck process 210 carried out in accordance with the principles of the present invention. The diffusion wetdeck process 210 comprises at least one chemical bath for cleaning semiconductor wafers. An exemplary chemical bath is represented in FIG. 2 by a chemical bath container 220 that contains a chemical bath liquid 225. As in the case of the prior art chemical baths, chemical bath liquid 225 may comprise a different type of chemical solution for each chemical bath. That is, each type of chemical bath will have a specific type of chemical solution.

An exemplary semiconductor wafer 230 to be cleaned is shown submerged in chemical bath liquid. Unlike the prior art process, the system and method of the present invention provides a fresh chemical source 235. Fresh chemical source 235 adds fresh chemical to chemical bath liquid 225 through conduit 240. Fresh chemical source 235 is under the control of fresh chemical source control unit 245. That is, fresh chemical source control unit 245 sends a control signal to fresh chemical source 235 to cause fresh chemical source 235 to regulate (i.e., turn on and turn off) the flow of fresh chemical to chemical bath liquid 225. Fresh chemical source control unit 245 may comprise a conventional computerized controller that is capable of executing software instructions to exercise control functions over fresh chemical source 235.

The system and method of the present invention also provides a chemical purge unit 250 that is capable of removing portions of chemical bath liquid 225 through conduit 255. Chemical purge unit 250 is under the control of chemical purge control unit 260. That is, chemical purge control unit 260 sends a control signal to chemical purge unit 250 to cause chemical purge unit 250 to purge (i.e., to remove) a portion of chemical bath liquid 225 from chemical bath container 220. Chemical purge control unit 260 may comprise a conventional computerized controller that is capable of executing software instructions to exercise control functions over chemical purge unit 250.

Fresh chemical source 235 and chemical purge unit 250 operate in conjunction to continuously maintain a chemical bath liquid 225 that is capable of effectively cleaning semiconductor wafers 230. In one advantageous embodiment of the invention, chemical purge unit 250 is periodically turned on to remove a portion of the chemical bath liquid 225. Fresh chemical source 235 is also periodically turned on to add a portion of fresh chemical to the chemical bath liquid 225. The amount of chemical bath liquid 226 that is removed by chemical purge unit 250 and the amount of fresh chemical that is added by fresh chemical source 235 are selected to maintain the effectiveness of the chemical bath liquid 225 to clean the semiconductor wafers 230.

In an alternate advantageous embodiment of the invention, fresh chemical source 235 and chemical purge unit 250 are not turned on periodically, but are both set to operate continuously. That is, fresh chemical source 235 is turned on to continuously add a specified amount of fresh chemical to chemical bath liquid 225. And, simultaneously, chemical purge unit 250 is turned on to continuously purge a specified amount of chemical bath liquid 225 from chemical bath container 220. The amount of chemical bath liquid 226 that is continuously removed by chemical purge unit 250 and the amount of fresh chemical that is continuously added by fresh chemical source 235 are selected to maintain the effectiveness of the chemical bath liquid 225 to clean the semiconductor wafers 230.

Figure 3:
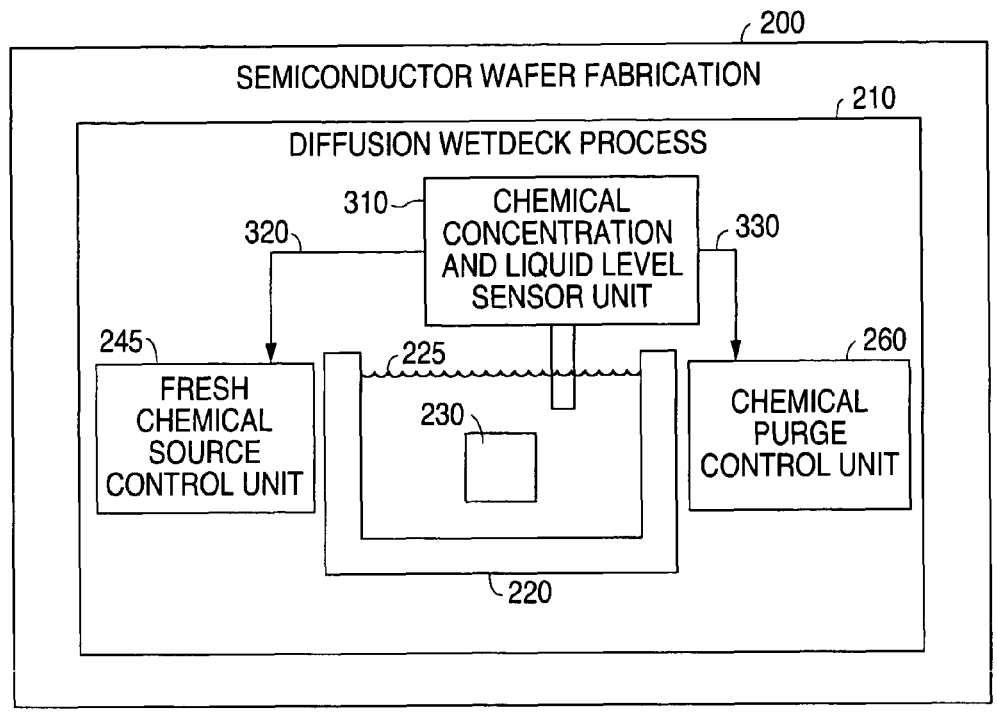
FIG. 3 illustrates diffusion wetdeck process of the present invention showing a chemical concentration sensor and a liquid level sensor for monitoring a chemical bath of the present invention.

As shown in FIG. 3, the concentration of the chemical within the chemical bath liquid 225 may be determined by using a chemical concentration sensor. In addition, the level of the chemical bath liquid 225 within chemical bath container 220 may also be determined by using a liquid level sensor. The chemical concentration sensor and the liquid level sensor are shown in FIG. 3 as a combined sensor unit 310. Sensor unit 310 sends information concerning the chemical concentration and the liquid level to fresh chemical source control unit 245 via signal, line 320. Sensor unit 310 also sends information concerning the chemical concentration and the liquid level to chemical purge control unit 260 via signal line 330.

Fresh chemical source control unit 245 uses the information from sensor unit 310 to calculate an appropriate amount of fresh chemical to be sent from fresh chemical source 235 to chemical bath liquid 225. In this manner fresh chemical source control unit 245 uses the information from sensor unit 310 as feedback to calculate a required amount of fresh chemical to add. For example, if the chemical concentration is too high, then fresh chemical source control unit 245 will turn off the fresh chemical source 235 until the level of chemical concentration falls to a level where additional fresh chemical is required.

Similarly, chemical purge control unit 260 uses the information from sensor unit 310 to calculate an appropriate amount of chemical bath liquid 225 to be purged. In this manner chemical purge control unit 260 uses the information from sensor unit 310 as feedback to calculate a required amount of chemical bath liquid to purge. For example, if the liquid level is too low, then chemical purge control unit 260 will turn off the chemical purge unit 250 until the liquid level rises to a level where additional liquid needs to be purged to maintain an appropriate liquid level.

Figure 4:
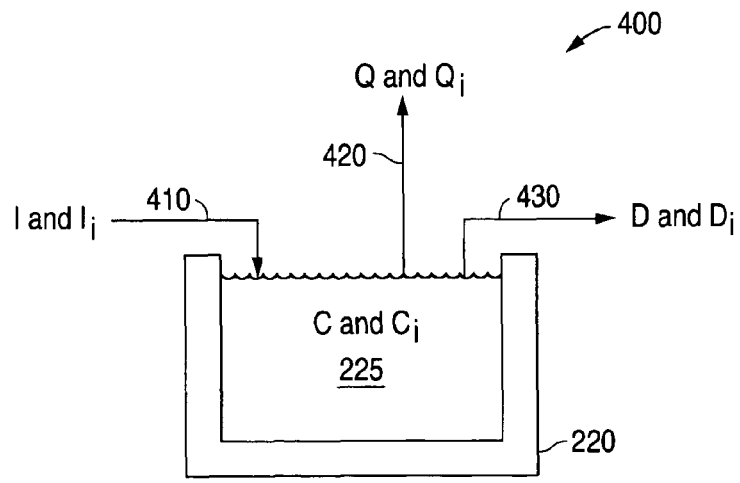
FIG. 4 illustrates a schematic representation of a mass balance diagram for a chemical bath of the present invention.

FIG. 4 illustrates a schematic representation of a mass balance diagram 400 for the chemical bath of the present invention. As before, chemical bath container 220 contains chemical bath liquid 225. The letter "I" represents an injection rate (in grams per hour) and the letter "$I_i$" represents an injection rate (in grams per hour) for an individual chemical species "i". The inputs to chemical bath liquid 225 are represented by an arrow designated with reference numeral 410.

The letter "C" represents an amount (in grams) of chemical in the chemical bath liquid 225 and the letter "$C_i$" represents an amount (in grams) of an individual chemical species "i" in the chemical bath liquid 225. The letter "Q" represents an evaporation rate (in grams per hour) and the letter "$Q_i$" represents an evaporation rate (in grams per hour) for an individual chemical species "i". The evaporations from chemical bath liquid 225 are represented by an arrow designated with reference numeral 420.

Lastly, the letter "D" represents a "drag out" rate (in grams per hour) and the letter "$D_i$" represents a "drag out" rate (in grams per hour) for an individual chemical species "i". The "drag out" rates from chemical bath liquid 225 are represented by an arrow designated with reference numeral 430.

To confirm the chemical dynamics of the system and method of the present invention, a mass balance equation was developed for a piranha bath. The input chemicals were hydrogen peroxide ($H_2O_2$) and sulfuric acid ($H_2SO_4$). The following constants were known:

$I_f$=a fixed hourly injection volume of $H_2O_2$
$I_2$=an injection volume of $H_2O_2$ per run
$D_1$=a fixed hourly drain volume
$D_2$="drag out" volume per run
R=run rate (in runs per hour)

$C_{EV}$ = a derived evaporation constant (in grams (gm) per hour (hr) per pounds per square inch absolute (psia))
$P^0$ = Pressure of superheated steam at 130° C. (2.7 atm)
$SG_{H2SO4}$ = Specific gravity of $H_2SO_4$ (1.834)
The input volume for $H_2O_2$ was given by:

$$I_{H2O2} = I_1 + (I_2 * R)$$

The total input volume (I) is the sum of the input volume for $H_2O_2$ ($I_{H2O2}$) and the input volume for $H_2SO_4$ ($I_{H2SO4}$):

$$I = I_{H2O2} + I_{H2SO4}$$

The evaporation rate ($Q_i$) was given by:

$$Q_i = C_{EV} * (P^0 X_{DI} - P_a) * A_{bath}$$

where $X_{DI}$ is a mole fraction of the chemical species "i", $P_a$ is the partial pressure of $H_2O$ in air, and $A_{bath}$ is the surface area of the bath in square inches (in²).

The "drag out" output was given by:

$$D = D_1 + (D_2 * R)$$

The purge rate P was given by:

$$P = R_{CON} / C_{CON}$$

where $R_{CON}$ is the average rate of contamination or chemical breakdown and where $C_{CON}$ is the target concentration of the contaminant or the process chemical.

In preparing the mass balance equation the following assumptions were made: (1) the elements of the chemical bath liquid 225 are perfectly mixed, and (2) hydrogen peroxide ($H_2O_2$) immediately breaks down to water ($H_2O$), and (3) the concentration of $H_2SO_5$ in the chemical bath is negligible at steady state, and (4) the concentration of other species is negligible, and (5) the evaporation of $H_2SO_4$ is negligible, and (6) the partial pressure of water in air ($P_a$) is negligible.

The mass balance equation is:

$$\frac{dC}{dt} = I - Q - D \quad (1)$$

The time rate of change of the amount of the chemical is equal to the input volume minus the evaporation minus the "drag out" volume. A similar mass balance equation holds for each chemical species "i":

$$\frac{dC_i}{dt} = I_i - Q_i - D_i \quad (2)$$

At the steady state condition the time rate of change of the amount of the chemical is zero. This means that the steady state expressions are:

$$I = Q + D \quad (3)$$

$$I_i = Q_i + D_i \quad (4)$$

Using these equations and conditions for a model piranha bath a numerical model was calculated that predicted that the process will stabilize after about eighteen (18) hours. This prediction roughly agrees with experimental data collected from the model piranha bath. The numerical model predicts that the process concentration, once stabilized, will remain roughly constant for long periods of time. Process engineering can use this data to set a maximum chemical bath life based on the accumulation of contamination such as particles, metallics or dopants in the chemical bath.

The present invention extends the effective working life of the chemical bath liquid 225 far beyond the effective working life of a prior art chemical bath liquid 130. The present invention eliminates the "down" time in the prior art method that occurs when a "solution change" must be carried out. In addition, the present invention reduces the ultimate chemical cost by using less chemical. The present invention also eliminates process variation that generally occurs when a chemical bath ages.

Figure 5:
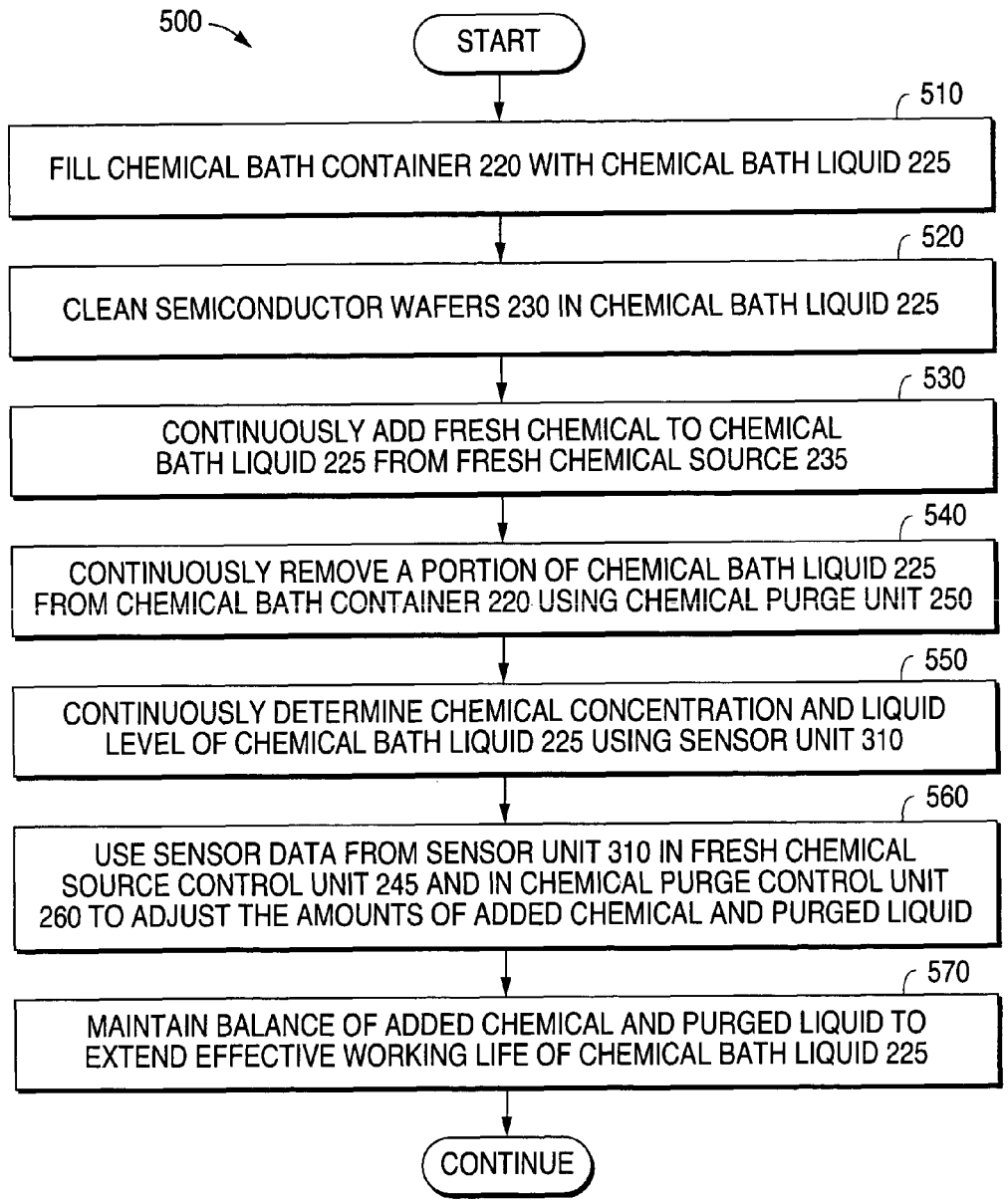
FIG. 5 illustrates a flow chart showing the steps of an advantageous embodiment of the method of the present invention.

FIG. 5 illustrates a flow chart showing the steps of an advantageous embodiment of the method of the present invention. In the first step of the method a chemical bath container 220 of a diffusion wetdeck process 210 is filled with a chemical bath liquid 225 (step 510). Semiconductor wafers 230 are then placed in the chemical bath liquid 225 and cleaned (step 520). Fresh chemical is continuously added to the chemical bath liquid 225 from a fresh chemical source 235 (step 530). A portion of the chemical bath liquid 225 is continuously removed from the chemical bath container 220 by chemical purge unit 250 (step 540).

The chemical concentration in the chemical bath liquid 225 and the liquid level of the chemical bath liquid 225 are continuously determined by chemical concentration and liquid level sensor unit 310 (step 550). Fresh chemical source control unit 245 and chemical purge control unit 260 use the sensor data from sensor unit 310 to adjust the amount of chemical added and the amount of chemical bath liquid 225 removed from chemical bath container 220 (step 560). In this manner the effective working life of the chemical bath liquid 225 is extended by maintaining the balance of the added chemical and the amount of the chemical bath liquid 225 that is removed (step 570).

An advantage of the method of the present invention is that contaminated levels of a chemical bath liquid 225 are continuously reduced over time. Because a portion of the chemical bath liquid 225 is being continuously removed from the chemical bath container 220, the contaminants in the chemical bath liquid 225 are also being continuously removed. When fresh chemical is added from the fresh chemical source 235, the fresh chemical effectively dilutes the contamination in chemical bath liquid 225. In contrast, the prior art methods remove the contamination during a "solution change." In other prior art methods the contamination is deposited on the surface of the semiconductor wafers. Deposition of contaminants on the surface of the semiconductor wafers may degrade the performance of the semiconductor wafers.

Although the present invention has been described with reference to a diffusion wetdeck process, it is understood that the present invention is not limited to use in a diffusion wetdeck process. The present invention may be used in any suitable semiconductor wetdeck process.

In another advantageous embodiment of the present invention more than one chemical bath container may be used. Consider the arrangement shown in FIG. 6. Fresh chemical source 610 provides fresh chemical through conduit 615 to chemical bath liquid 620 in chemical bath container 625. Chemical purge unit 635 removes portions of chemical bath liquid 620 through conduit 630. For clarity of explanation the fresh chemical source control unit for fresh chemical source 610 is not shown in FIG. 6. Similarly, the chemical purge control unit for chemical purge unit 635 is also not shown in FIG. 6.

The chemical bath liquid 620 that is removed from the chemical bath container 625 by chemical purge unit 635 is provided through conduit 640 to chemical bath liquid 645 within chemical bath container 650. The chemical bath liquid 620 from chemical bath container 625 is provided to chemical bath container 650 in the same manner as fresh chemical is provided to chemical bath container 625.

Chemical purge unit 660 removes portions of chemical bath liquid 645 through conduit 655. For clarity of explanation the control unit for chemical purge unit 635 is not shown in FIG. 6. Similarly, the chemical purge control unit for chemical purge unit 660 is also not shown in FIG. 6. The chemical bath liquid 645 that is purged by chemical purge unit 660 passes through conduit 665 to disposal drain 670.

The arrangement set forth in FIG. 6 is one in which the purge stream from chemical bath container 625 serves as the fresh chemical supply stream for chemical bath container 650. This means that chemical bath liquid 645 in chemical bath container 650 is "dirtier" than the chemical bath liquid 620 in chemical bath container 625. That is, the chemical bath liquid 645 contains more contaminants than the chemical bath liquid 620. The semiconductor wafers to be processed are first processed in the "dirtier" chemical bath liquid 645. After the semiconductor wafers have been processed in the chemical bath liquid 645 they are then transferred to the "cleaner" chemical bath liquid 620 for additional processing. The operation of the "cleaner" chemical bath liquid 620 is more effective than the operation of the "dirtier" chemical bath liquid 645.

In the example shown in FIG. 6 the semiconductor wafers are processed in a two stage process. The first stage employs chemical purge unit 635 (operating as a source of "fresh" chemical), conduit 640, chemical bath liquid 645, chemical bath container 650, conduit 655, and chemical purge unit 660 (and the associated control units not shown in FIG. 6). The elements of the first stage may be collectively referred to as a first chemical bath unit.

The second stage employs fresh chemical source 610, conduit 615, chemical bath liquid 620, chemical bath container 625, conduit 630, and chemical purge unit 635 (and the associated control units not shown in FIG. 6). The elements of the second stage may be collectively referred to as a second chemical bath unit.

In another advantageous embodiment of the present invention more than one chemical bath unit may be used. FIG. 7 illustrates a chain 700 of "M" chemical bath units of the present invention coupled in series. A fresh chemical source 710 is coupled to and provides fresh chemical to chemical bath unit "M" 720. Chemical bath unit "M" 720 is coupled to chemical bath unit "M-1" 730. The purge stream output from chemical bath unit "M" 720 is provided as input to chemical bath unit "M-1" 730. The chemical bath unit "M-1" is coupled to the next chemical bath unit in the chain 700.

Eventually, the chain 700 similarly continues down to chemical bath unit "2" 740. The purge stream output from chemical bath unit "2" 740 is provided as input to chemical bath unit "1" 750. The purge stream output from chemical bath unit "1" 750 is sent to disposal drain 760. The use of multiple chemical bath units has the advantage of faster throughput because the constraint time is effectively reduced by the presence of the additional chemical bath units in the chain 700. The letter "M" represents any integer that is greater than or equal to 2. (i.e., "M"≧2).

Figure 8:
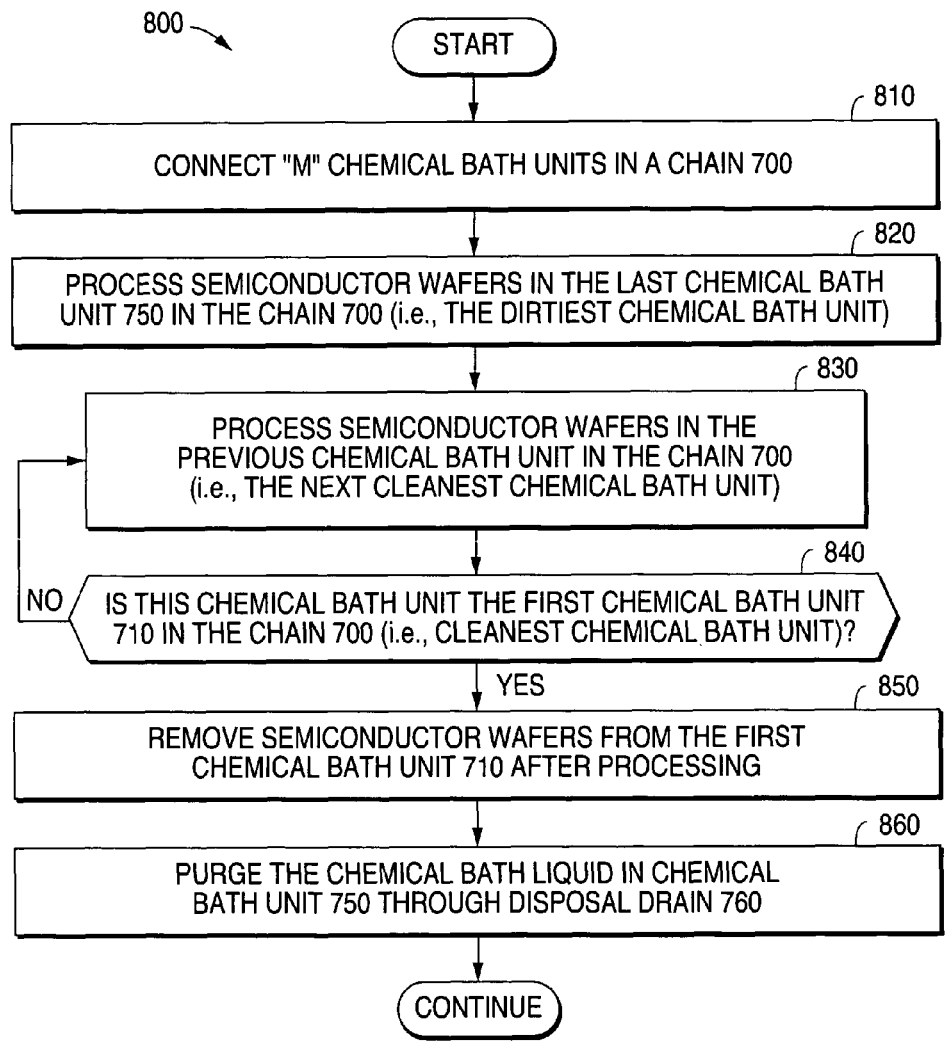
FIG. 8 illustrates a flow chart showing the steps of an advantageous embodiment of the method of the present invention for operating the chain of chemical bath units shown in FIG. 7.

FIG. 8 illustrates a flow chart 800 showing the steps of an advantageous embodiment of the method of the present invention for operating the chain 700 of "M" chemical bath units shown in FIG. 7. In the first step, "M" chemical bath units of the present invention are connected in series to form chain 700 (step 810). Then the semiconductor wafers are processed in the last chemical bath unit 750 in the chain 700 (step 820). The last chemical bath unit 750 in the chain 700 is the "dirtiest" chemical bath unit.

Then the semiconductor wafers are processed in the previous chemical bath unit in the chain 700 (step 830). The previous chemical bath unit in the chain 700 is the next cleanest chemical bath unit in the chain 700. Then a determination is made to determine whether the current chemical bath unit is the first chemical bath unit 710 in the chain 700 (decision step 840). If the current chemical bath unit is not the first chemical bath unit 710, then the control of the method returns to step 830 and the semiconductor wafers are processed in the previous chemical bath unit in the chain 700.

If the current chemical bath unit is the first chemical bath unit 710 (i.e., the cleanest chemical bath unit), then the semiconductor wafers are removed from the first chemical bath unit 710 after processing (step 850). The chemical bath liquid in chemical bath unit 750 is purged through disposal drain 760 (step 860).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for extending an effective working life of a first chemical bath comprising a first chemical bath liquid within a first chemical bath container, the method comprising the steps of:
   adding an amount of fresh chemical to the first chemical bath liquid within the first chemical bath container;
   purging an amount of the first chemical bath liquid from the first chemical bath container, wherein the amount of fresh chemical added to the first chemical bath liquid is based on the amount of the first chemical bath liquid purged from the first chemical bath container;
   providing the amount of the purged first chemical bath liquid to a second chemical bath comprising a second chemical bath liquid within a second chemical bath container, wherein the second chemical bath liquid comprises contaminants contained in the amount of the purged first chemical bath liquid; and
   using the first and second chemical bath liquids in the first and second chemical baths to clean a semiconductor wafer in a wetdeck process;
   wherein each of the chemical bath containers comprises an independent structure that is separated from other chemical bath containers; and
   wherein the chemical baths are used to clean the semiconductor wafer in order of decreasing amounts of contamination in the chemical bath liquids of the chemical baths.

2. The method as set forth in claim 1 wherein said step of adding the amount of fresh chemical to said first chemical bath liquid comprises the step of:
   continuously adding the amount of fresh chemical to said first chemical bath liquid.

3. The method as set forth in claim 1 wherein said step of purging the amount of said first chemical bath liquid from said first chemical bath container comprises the step of:
   continuously purging the amount of said first chemical bath liquid from said first chemical bath container.

4. The method as set forth in claim 1 further comprising the step of:
   continuously determining a concentration of said chemical in said first chemical bath liquid.

5. The method as set forth in claim 4 further comprising the step of:
   continuously adjusting the amount of fresh chemical that is added to said first chemical bath liquid in response to said determination of said concentration of said chemical in said first chemical bath liquid.

6. The method as set forth in claim 1 further comprising the step of:
continuously determining a liquid level of said first chemical bath liquid.

7. The method as set forth in claim 6 further comprising the step of:
continuously adjusting the amount of first chemical bath liquid that is purged from said first chemical bath container in response to said determination of said liquid level of said first chemical bath liquid.

8. The method as set forth in claim 1 further comprising the step of:
maintaining a balance between said amount of fresh chemical added to said first chemical bath liquid and said amount of said first chemical bath liquid purged from said first chemical bath container to maintain an effectiveness of said first chemical bath liquid to clean the semiconductor wafer.

9. A method for extending an effective working life of a first chemical bath comprising a first chemical bath liquid within a first chemical bath container, the method comprising the steps of:
continuously adding an amount of fresh chemical to the first chemical bath liquid within the first chemical bath container;
continuously purging an amount of the first chemical bath liquid from the first chemical bath container, wherein the amount of fresh chemical added to the first chemical bath liquid is based on the amount of the first chemical bath liquid purged from the first chemical bath container;
continuously providing the amount of the purged first chemical bath liquid to a second chemical bath comprising a second chemical bath liquid within a second chemical bath container, wherein the second chemical bath liquid comprises contaminants contained in the amount of the purged first chemical bath liquid; and
using the first and second chemical bath liquids in the first and second chemical baths to clean a semiconductor wafer in a wetdeck process;
wherein each of the chemical bath containers comprises an independent structure that is separated from other chemical bath containers; and
wherein the chemical baths are used to clean the semiconductor wafer in order of decreasing amounts of contamination in the chemical bath liquids of the chemical baths.

10. The method as set forth in claim 9 further comprising the step of:
maintaining a balance between said amount of fresh chemical continuously added to said first chemical bath liquid and said amount of said first chemical bath liquid continuously purged from said first chemical bath container to maintain an effectiveness of said first chemical bath liquid to clean the semiconductor wafer.

11. The method as set forth in claim 9 further comprising the step of:
continuously determining a concentration of said chemical in said first chemical bath liquid.

12. The method as set forth in claim 11 further comprising the step of:
continuously adjusting the amount of fresh chemical that is added to said first chemical bath liquid in response to said determination of said concentration of said chemical in said first chemical bath liquid.

13. The method as set forth in claim 9 further comprising the step of:
continuously determining a liquid level of said first chemical bath liquid.

14. The method as set forth in claim 13 further comprising the step of:
continuously adjusting the amount of first chemical bath liquid that is purged from said first chemical bath container in response to said determination of said liquid level of said first chemical bath liquid.

15. A method for operating a first chemical bath unit and a second chemical bath unit, the method comprising the steps of:
coupling the first chemical bath unit to the second chemical bath unit, wherein each of the chemical bath units comprises a chemical bath liquid within a chemical bath container;
adding an amount of fresh chemical to the chemical bath liquid of the first chemical bath unit;
purging an amount of the chemical bath liquid from the first chemical bath unit, wherein the amount of fresh chemical added to the chemical bath liquid of the first chemical bath unit is based on the amount of the chemical bath liquid purged from the first chemical bath unit;
providing the amount of the purged chemical bath liquid to the second chemical bath unit, wherein the chemical bath liquid of the second chemical bath unit comprises contaminants contained in the amount of the purged chemical bath liquid; and
using the chemical bath liquids in the chemical bath units to clean at least one semiconductor wafer in a wetdeck process;
wherein each of the chemical bath containers in the chemical bath units comprises an independent structure that is separated from other chemical bath containers; and
wherein the chemical bath units are used to clean the at least one semiconductor wafer in order of decreasing amounts of contamination in the chemical bath liquids of the chemical bath units.

16. The method as set forth in claim 15 further comprising the steps of:
receiving in the chemical bath liquid of said second chemical bath unit the amount of said purged chemical bath liquid from said first chemical bath unit; and
purging an amount of said chemical bath liquid from said second chemical bath unit.

17. The method as set forth in claim 16 wherein using the chemical bath liquids in the chemical bath units comprises:
processing the at least one semiconductor wafer in said second chemical bath unit; and
subsequently processing said at least one semiconductor wafer in said first chemical bath unit.

18. A method for operating two or more chemical bath units, the method comprising the steps of:
coupling the two or more chemical bath units in series, wherein a first of the chemical bath units comprises a first chemical bath liquid;
adding an amount of fresh chemical to the first chemical bath liquid of the first chemical bath unit;
purging an amount of the first chemical bath liquid from the first chemical bath unit, wherein the amount of fresh chemical added to the first chemical bath liquid is based on the amount of the first chemical bath liquid purged from the first chemical bath unit;
providing the amount of the purged first chemical bath liquid to a subsequent one of the chemical bath units, wherein a subsequent chemical bath liquid in the subsequent chemical bath unit comprises contaminants contained in the amount of the purged first chemical bath liquid; and using the chemical bath liquids in the chemical bath units to clean at least one semiconductor wafer in a wetdeck process;

wherein each of the chemical bath units comprises an independent container structure holding its chemical bath liquid that is separated from other chemical bath container structures; and wherein the chemical bath units are used to clean the at least one semiconductor wafer in order of decreasing amounts of contamination in the chemical bath liquids of the chemical bath units.

19. The method as set forth in claim 18 wherein the two or more chemical bath units comprise the first chemical bath unit and multiple subsequent chemical bath units, each subsequent chemical bath unit comprising a subsequent chemical bath liquid within a subsequent chemical bath container, and wherein said method further comprises the steps of:

receiving in each subsequent chemical bath unit an amount of previous chemical bath liquid from a previous chemical bath unit; and purging an amount of subsequent chemical bath liquid from said subsequent chemical bath unit.

20. The method as set forth in claim 19 wherein using the chemical bath liquids in the chemical bath units comprises:

processing the at least one semiconductor wafer in a last chemical bath unit of said chemical bath units;

subsequently processing said at least one semiconductor wafer in each previous chemical bath unit of said chemical bath units; and subsequently processing said at least one semiconductor wafer in said first chemical bath unit of said chemical bath units.

21. A method comprising:

adding an amount of fresh chemical to a first chemical bath liquid in a first chemical bath;

purging an amount of the first chemical bath liquid from the first chemical bath, wherein the amount of fresh chemical added to the first chemical bath liquid is based on the amount of the first chemical bath liquid purged from the first chemical bath;

providing the amount of the purged first chemical bath liquid to a second chemical bath, wherein a second chemical bath liquid in the second chemical bath comprises contaminants contained in the amount of the purged first chemical bath liquid; and using the chemical bath liquids in the chemical baths to clean at least one semiconductor wafer in a wetdeck process;

wherein each of the chemical baths comprises an independent container structure holding its chemical bath liquid that is separated from other chemical bath container structures; and wherein the chemical baths are used to clean the at least one semiconductor wafer in order of decreasing amounts of contamination in the chemical bath liquids of the chemical baths.

22. The method of claim 21, further comprising:

purging an amount of the second chemical bath liquid from the second chemical bath, the second chemical bath liquid comprising the amount of the purged first chemical bath liquid; and providing the amount of purged second chemical bath liquid to a third chemical bath.

23. The method of claim 21, wherein:

a series of chemical baths comprises the first chemical bath, the second chemical bath, and a last chemical bath; and further comprising disposing of an amount of a last chemical bath liquid from the last chemical bath.

24. The method of claim 21, wherein using the chemical bath liquids in the chemical baths comprises:

processing the semiconductor wafer in the second chemical bath; and subsequently processing the semiconductor wafer in the first chemical bath.

25. A method comprising:

adding an amount of fresh chemical to a first chemical bath liquid in a first chemical bath;

transferring an amount of the first chemical bath liquid from the first chemical bath to a second chemical bath, wherein the amount of fresh chemical added to the first chemical bath liquid is based on the amount of the first chemical bath liquid transferred from the first chemical bath, and wherein a second chemical bath liquid in the second chemical bath comprises contaminants contained in the amount of the transferred first chemical bath liquid; and using the chemical bath liquids in the chemical baths to clean at least one semiconductor wafer in a wetdeck process;

wherein each of the chemical baths comprises an independent container structure holding its chemical bath liquid that is separated from other chemical bath container structures; and wherein the chemical baths are used to clean the at least one semiconductor wafer in order of decreasing amounts of contamination in the chemical bath liquids of the chemical baths.

26. The method of claim 25, further comprising:

transferring an amount of the second chemical bath liquid from the second chemical bath to a third chemical bath, the second chemical bath liquid comprising the amount of the first chemical bath liquid from the first chemical bath.

27. The method of claim 25, wherein:

a series of chemical baths comprises the first chemical bath, the second chemical bath, and a last chemical bath; and further comprising disposing of an amount of a last chemical bath liquid from the last chemical bath.

28. The method of claim 25, wherein using the chemical bath liquids in the chemical baths comprises:

processing the semiconductor wafer in the second chemical bath; and subsequently processing the semiconductor wafer in the first chemical bath.

29. A method comprising:

adding an amount of fresh chemical to a first chemical bath liquid in a first chemical bath;

transferring an amount of the first chemical bath liquid from the first chemical bath to a second chemical bath, wherein the amount of fresh chemical added to the first chemical bath liquid is based on the amount of the first chemical bath liquid transferred from the first chemical bath, and wherein a second chemical bath liquid in the second chemical bath unit comprises contaminants contained in the amount of the transferred first chemical bath liquid; and processing the semiconductor wafers in order of decreasing amounts of contamination in the chemical bath liquids of the chemical baths;

wherein each of the chemical baths comprises an independent container structure holding its chemical bath liquid that is separated from other chemical bath container structures.

30. The method of claim 29, wherein processing the semiconductor wafers in the chemical baths comprises processing the semiconductor wafers in a third chemical bath before processing the semiconductor wafers in the second chemical bath; and further comprising transferring an amount of the second chemical bath liquid from the second chemical bath to the third chemical bath, the second chemical bath liquid comprising the amount of the first chemical bath liquid from the first chemical bath.

31. The method of claim 29, wherein processing the semiconductor wafers in the chemical baths comprises processing the semiconductor wafers in a last chemical bath before processing the semiconductor wafers in the first and second chemical baths; and further comprising disposing of an amount of a last chemical bath liquid from the last chemical bath.

32. The method of claim 29, wherein the second chemical bath comprises more contaminants than the first chemical bath.

* * * * *